(12) United States Patent
Atanackovic

(10) Patent No.: US 7,037,806 B1
(45) Date of Patent: May 2, 2006

(54) METHOD OF FABRICATING SILICON-ON-INSULATOR SEMICONDUCTOR SUBSTRATE USING RARE EARTH OXIDE OR RARE EARTH NITRIDE

(75) Inventor: Petar B. Atanackovic, Palo Alto, CA (US)

(73) Assignee: Translucent Inc., Palo Alto, CA (US)

( * ) Notice: Subject to any disclaimer, the term of this patent is extended or adjusted under 35 U.S.C. 154(b) by 0 days.

(21) Appl. No.: 11/054,627

(22) Filed: Feb. 9, 2005

(51) Int. Cl.
*H01L 21/46* (2006.01)
*H01L 21/30* (2006.01)

(52) U.S. Cl. .................. 438/458; 438/459; 438/527; 438/528; 438/480

(58) Field of Classification Search ............... 438/455, 438/458, 459, 471, 473, 510, 527, 528, 530, 438/149, 162, 479, 480
See application file for complete search history.

(56) References Cited

U.S. PATENT DOCUMENTS

| | | | |
|---|---|---|---|
| 5,107,538 A * | 4/1992 | Benton et al. ............... 385/130 |
| 5,119,460 A * | 6/1992 | Bruce et al. ................. 385/142 |
| 6,734,453 B1 * | 5/2004 | Atanackovic et al. ......... 257/19 |
| 6,858,864 B1 * | 2/2005 | Atanackovic et al. ......... 257/17 |
| 2004/0214362 A1 * | 10/2004 | Hill et al. ..................... 438/33 |
| 2004/0224082 A1 * | 11/2004 | Chen et al. ................... 427/66 |
| 2005/0056204 A1 * | 3/2005 | Kurashige et al. ............. 117/2 |

* cited by examiner

*Primary Examiner*—Hoai Pham
*Assistant Examiner*—Khanh Duong
(74) *Attorney, Agent, or Firm*—Parsons & Goltry; Robert A. Parsons; Michael W. Goltry

(57) ABSTRACT

A method of fabricating a semiconductor-on-insulator semiconductor substrate is disclosed that includes providing first and second semiconductor substrates. Either oxygen or nitrogen is introduced into a region adjacent the surface of the first semiconductor substrate and a rare earth is introduced into a region adjacent the surface of the second semiconductor substrate. The surface of the first semiconductor substrate is bonded to the surface of the second semiconductor substrate in a process that includes annealing to react either the oxygen or the nitrogen with the rare earth to form an interfacial insulating layer of either rare earth oxide or rare earth nitride. A portion of either the first semiconductor substrate or the second semiconductor substrate is removed and the surface polished to form a thin crystalline active layer on the insulating layer.

15 Claims, 4 Drawing Sheets

METHOD OF FABRICATING SILICON-ON-INSULATOR SEMICONDUCTOR SUBSTRATE USING RARE EARTH OXIDE OR RARE EARTH NITRIDE

FIELD OF THE INVENTION

This invention relates to crystalline silicon on an insulator layer for use in the semiconductor industry.

BACKGROUND OF THE INVENTION

In the semiconductor industry it is common to form a layer of crystalline silicon (generally referred to as an active layer) on an insulating layer to reduce any effects or interactions between the substrate (or handle wafer) on one side of the insulating layer and components formed on or in the crystalline layer on the other side of the insulating layer. At the present time the preferred insulating layer is formed of silicon dioxide ($SiO_2$) because of the ease in forming the layer and because bonding between the silicon dioxide and the silicon of the handle wafer is easy to achieve. In this disclosure the term "crystalline silicon" is used to denote a layer of silicon that is substantially single crystal material, i.e. as much of a single crystal as can be formed using present day techniques.

One common method of forming a silicon dioxide insulating layer between a substrate and a crystalline silicon layer is to provide two silicon substrates and form a layer of silicon dioxide on the surface of one of the substrate. At present the film of silicon dioxide is almost always formed by thermal oxidation, i.e. heating the substrate in a high humidity (such as steam). The silicon dioxide surface is then brought into contact with the surface of the second silicon substrate and forms a molecular bond through a well known process, referred to in the industry as Van der Waal bonding. One of the substrates is then partially removed by any of several different methods to leave a thin crystalline layer of silicon on the silicon dioxide layer. This in effect forms a buried oxide (BOX) insulator layer.

One method of removing a substantial portion of the substrate is to implant hydrogen, which is then annealed to form a weakened fracture plane. The substrate is then cleaved at the fracture plane and the surface is polished to a mirror surface using well known chemical mechanical polishing (CMP) techniques. Some methods have been introduced to improve the cleaving and polishing, see for example U.S. Pat. No. 6,372,609, entitled "Method of Fabricating SOI Wafer by Hydrogen ION Delamination Method and Wafer Fabricated by the Method", issued Apr. 16, 2002.

One problem with the crystalline silicon on a silicon dioxide insulating layer is the strain produced by stress introduced at the junction by the lattice mismatch between the silicon and the thermally formed silicon dioxide. The lattice mismatch results in a relatively high compressive stress at the junction between the two materials. In many instances this high stress can result in dislocations, crystalline defects, and even fractures in the active layer. Some components can be formed in the crystalline layer that use this compressive stress to an advantage, however, since the compressive stress will be across the entire wafer it will affect all components formed in/on the crystalline layer, many to a highly undesirable degree. To provide an unstressed or unstrained active layer, the thickness of the silicon dioxide layer must be severely limited to a thickness at which the stress substantially disappears. That is, in each atomic layer of the silicon dioxide a small amount of the stress can be removed by lattice matching until, ultimately, all stress is removed (stress distribution). An improved method of removing or engineering the stress is disclosed in a copending application, entitled "Silicon-on-Insulator Semiconductor Wafer", filed of even date herewith, and incorporated herein by reference.

When the active layer is stressed by forming it only on a silicon dioxide insulating layer it can not be treated as bulk silicon because it will be elastically deformed (i.e. strained) by the stress when the layer is too thin. If the stress is not removed or otherwise compensated, the crystalline silicon layer on the insulating layer must be made relatively thick to prevent elastic deformation. This means that transistors on/in the crystalline silicon layer are formed either partially depleted or substantial cost and effort must be expended to form a fully depleted crystalline silicon layer. Also, because the silicon dioxide layer allows some migration of impurities into the active layer from the substrate (handle wafer) both of the substrates must be high quality wafers, which adds substantial expense. Further, the silicon dioxide may contain impurities (e.g. hydrogen molecules introduced during the oxidation process) that can migrate into the active layer. Additionally, the silicon dioxide is a relatively poor insulator and allows leakage current to flow when used in transistors, CMOS circuits, and the like.

It would be highly advantageous, therefore, to remedy the foregoing and other deficiencies inherent in the prior art.

Accordingly, it is an object of the present invention to provide new and improved silicon-on-insulator semiconductor wafers or substrates.

Another object of the invention is to provide a new and improved silicon-on-insulator semiconductor wafer or substrates with an insulating layer that reduces stress and improves the insulation quality.

Another object of the invention is to provide new and improved silicon-on-insulator semiconductor wafers or substrates that can be formed thin enough to provide fully depleted crystalline silicon layers above insulating layers.

And another object of the invention is to provide new and improved silicon-on-insulator semiconductor wafers or substrates with an insulating layer that prevents impurities from migrating into the active layer and reduces leakage current in semiconductor devices.

Still another object of the present invention is to provide new and improved silicon-on-insulator semiconductor wafers or substrates that can be formed fully depleted on insulating layers and that require fewer manufacturing steps and are less expensive.

SUMMARY OF THE INVENTION

Briefly, to achieve the desired objects of the instant invention in accordance with a preferred embodiment thereof, provided is a method of fabricating a semiconductor-on-insulator semiconductor substrate that includes providing first and second semiconductor substrates. Either oxygen or nitrogen is introduced into a region adjacent the surface of the first semiconductor substrate and a rare earth is introduced into a region adjacent the surface of the second semiconductor substrate. The surface of the first semiconductor substrate is bonded to the surface of the second semiconductor substrate in a process that includes annealing to react either the oxygen or the nitrogen with the rare earth to form an interfacial insulating layer of either rare earth oxide or rare earth nitride. A portion of either the first semiconductor substrate or the second semiconductor substrate is removed and the surface polished to form a thin crystalline active layer on the insulating layer.

A semiconductor-on-insulator semiconductor substrate formed by the new method includes a silicon substrate, a thin crystalline silicon layer, and a layer of either rare earth oxide or rare earth nitride bonding the silicon substrate to the thin crystalline silicon layer to form an interfacial insulating layer of either the rare earth oxide or the rare earth nitride. Some examples of rare earth oxides and nitrides that can be used are Erbium oxide, Erbium nitride, Ytterbium oxide, and Ytterbium nitride. Because of the thin insulating layer and the method of formation, the thin crystalline silicon layer is thin enough to provide fully depleted semiconductor components and will generally have a thickness in a range of 150 angstroms to 500 angstroms.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
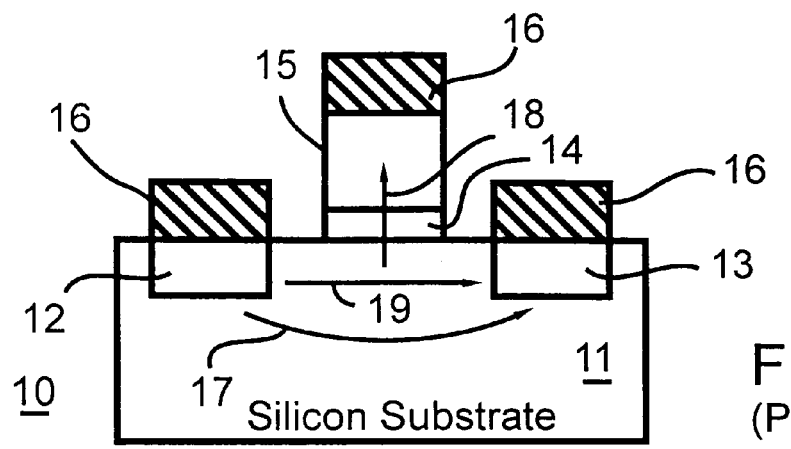
FIG. 1 is a simplified sectional view of a standard transistor on a silicon substrate.

Turning now to the drawings, attention is first directed to FIG. 1, which illustrates a simplified sectional view of a standard transistor 10 as known in the art. Transistor 10 is formed directly on a silicon substrate 11 by forming spaced apart p and n wells 12 and 13, respectively, in the surface of substrate 11. A thin gate oxide layer 14 is formed on the surface of substrate 11 between wells 12 and 13 and a gate stack 15 is formed on oxide layer 14. Metal contacts 16 are formed on each of wells 12 and 13 and on gate stack 15 by a well known metallization process.

As is known in the art, one major problem with transistor 10 is direct leakage between wells 12 and 13 through the bulk of substrate 10, depicted by arrow 17. This leakage severely limits the minimum spacing that can be provided between wells 12 and 13 and, thus, severely limits the minimum size of transistor 10. Also, gate oxide layer 14 allows current leakage, depicted by arrow 18, from the desired current path, depicted by arrow 19, into the gate circuit. This current leakage occurs because gate oxide layer 14 is traditionally silicon dioxide, which is a relatively poor insulator and because it is highly desirable to make the gate oxide layer as thin as possible to reduce the required gate control voltage.

Figure 2:
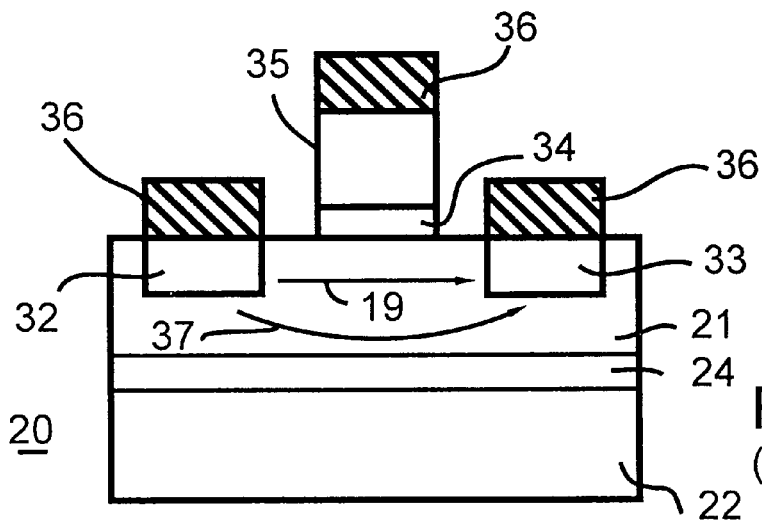
FIG. 2 is a simplified sectional view of a transistor formed in a crystalline layer on a partially depleted silicon dioxide insulating layer.

The semiconductor industry has attempted to solve some of the above problems by forming a transistor 20 on/in a partially depleted crystalline silicon layer 21 formed on a silicon dioxide insulating layer 24, known in the industry as silicon-on-insulator (SOI). As illustrated in FIG. 2, a silicon substrate 22 is provided with silicon dioxide layer 24 and crystalline silicon layer 21 by any convenient method, such as that described in U.S. Pat. No. 6,372,609, entitled "Method of Fabricating SOI Wafer by Hydrogen ION Delamination Method and Wafer Fabricated by the Method", issued Apr. 16, 2002. Transistor 20 is formed on crystalline silicon layer 21 by forming spaced apart p and n wells 32 and 33, respectively, in the surface of layer 21. A thin gate oxide layer 34 is formed on the surface of layer 21 between wells 32 and 33 and a gate stack 35 is formed on oxide layer 34. Metal contacts 36 are formed on each of wells 32 and 33 and on gate stack 35 by a well known metallization process.

Partially depleted crystalline silicon layer 21 formed on silicon dioxide insulating layer 24 only partially solves the problems outlined above because, for one reason, some direct leakage between wells 32 and 33 still occurs through partially depleted crystalline silicon layer 21, depicted by arrow 37. This leakage is still great enough to limit the minimum spacing that can be provided between wells 32 and 33 and, thus, limit the minimum size of transistor 20. Also, the leakage of gate oxide layer 34 has not been altered and, therefore, the thickness of gate oxide layer 34 cannot be reduced further in this structure.

Figure 3:
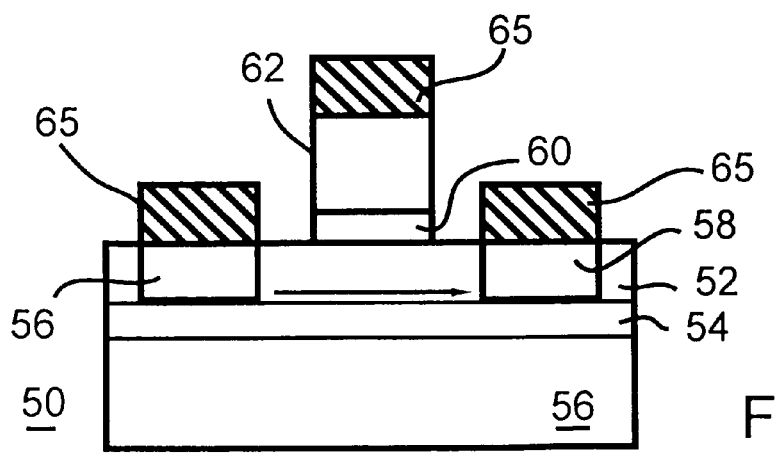
FIG. 3 is a simplified sectional view of a transistor formed in a crystalline layer on a fully depleted insulating layer in accordance with the present invention.

Turning to FIG. 3, a simplified sectional view of a transistor 50 formed in/on a crystalline layer 52 on a fully depleted insulating layer 54 on a silicon substrate 56, in accordance with the present invention, is illustrated. Transistor 50 is formed in/on crystalline layer 52 by forming spaced apart p and n conduction areas 56 and 58, respectively, in crystalline layer 52. Because crystalline layer 52 is extremely thin (e.g. generally in a range of 150 to 500 angstroms) conduction areas 56 and 58 reach from the surface to insulating layer 54 (fully depleted) and can be formed in any of variety of very simple processes, such as low energy implanting particles, infusion or migration from material deposited on the surface, etc. A thin gate insulating layer 60 is formed on the surface of crystalline layer 52 between conduction areas 56 and 58 and a gate stack 62 is formed on gate insulating layer 60. Metal contacts 65 are formed on each of conduction areas 56 and 58 and on gate stack 62 by any convenient metallization process.

The formation of a silicon-on-insulator substrate or wafer that can be used in the manufacture of semiconductor components, similar to transistor 50, is explained in detail below. As will be understood by those skilled in the art after a careful reading of the description, fewer process steps are required in the fabrication of the fully depleted silicon-on-insulator substrate or wafer and the process is not only simple but cost effective.

Figure 4:
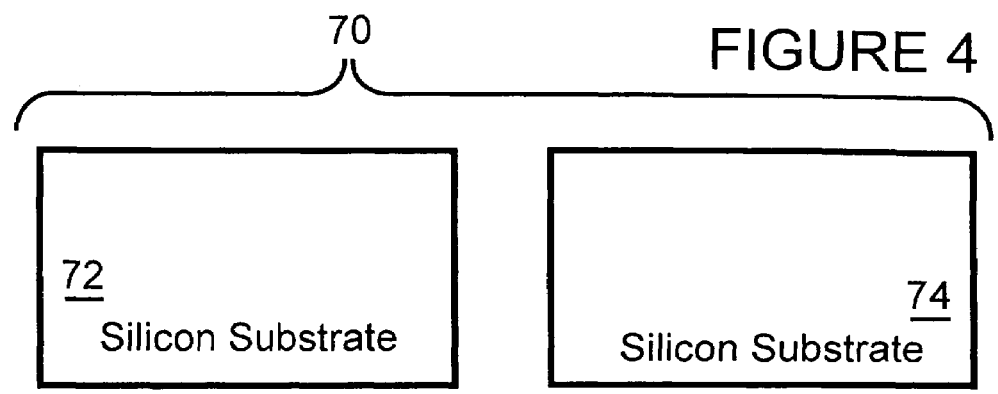
FIG. 4 is a simplified side view of a pair of silicon substrates illustrating a first step in a silicon-on-insulator (SOI) fabrication process in accordance with the present invention.

Turning now to FIGS. 4 through 10, in which like reference characters indicate corresponding elements throughout the several views, attention is first directed to FIG. 4, which illustrates a simplified side view of an interim point in a fabrication process in accordance with the present invention. Illustrated in FIG. 4 are a first silicon substrate 72 and a second silicon substrate 74, which are basic components of a silicon-on-insulator (SOI) wafer 70. As will be understood from the following description, substrate 72 is referred to as the handle substrate and substrate 74 is processed to produce an active layer of crystalline silicon. Under normal manufacturing procedures both substrates 72 and 74 are silicon wafers, although any size substrate or portion of a wafer could be used in the following procedures, if desired.

Figure 5:
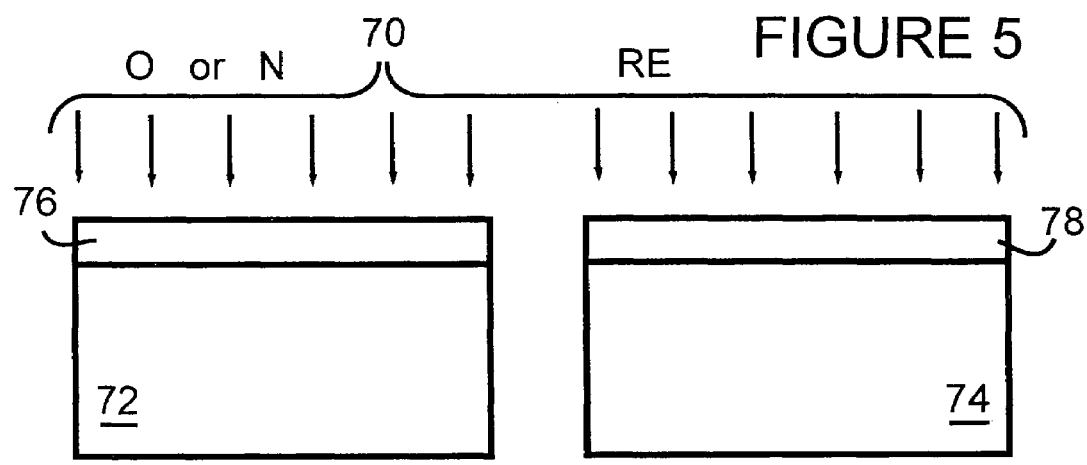
FIG. 5 is a view similar to FIG. 4 illustrating another point in the SOI fabrication process.

As shown in FIG. 5, substrate 72 is processed to produce a region or film 76 of oxygen or nitrogen rich silicon at one surface thereof. The process can be any well known process, such as low energy implanting or evaporation, to provide the oxygen or nitrogen close to the surface but generally un-reacted with the silicon. Also, substrate 74 has been processed to produce, in this preferred embodiment, a rare earth (RE) rich region or film 78 at one surface thereof. The process can be any well known process, such as low energy implanting or evaporation, to provide the rare earth close to the surface but generally un-reacted with the silicon. While any of the materials known as 'rare earths' can be used, two preferred examples are Erbium (Er) and Ytterbium (Yb). Other typical examples of rare earth materials that can be used in this application are described in U.S. Provisional Application No. 60/533,378, filed 29 Dec. 2003, incorporated herein by reference. Generally, region 76 will be much thinner than region 78.

Figure 6:
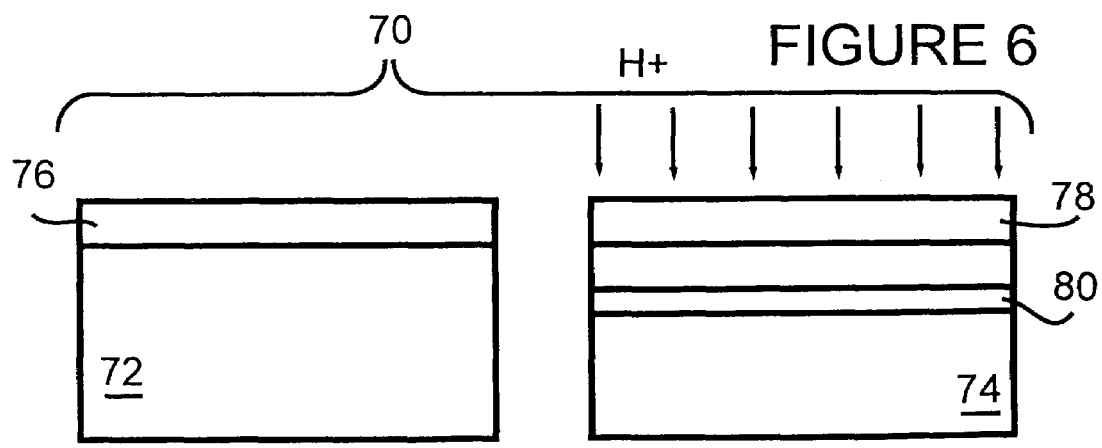
FIGS. 6, 7, 8, 9, and 10 are side views of the semiconductor substrates of FIG. 5 illustrating additional steps in the SOI fabrication process.

Referring to FIG. 6, hydrogen is implanted into substrate 74 to form a region or layer 80 spaced below region or film 78 a specified distance. It will be understood by those skilled in the art that the distance layer 80 is below film 78 is determined by the implant energy used. Also, it will be understood that the portion of substrate 74 between regions 78 and 80 will ultimately be the crystalline silicon active layer in/on which components are formed and, therefore, is generally very thin (e.g. generally in a range of 150 to 500 angstroms).

Figure 7:
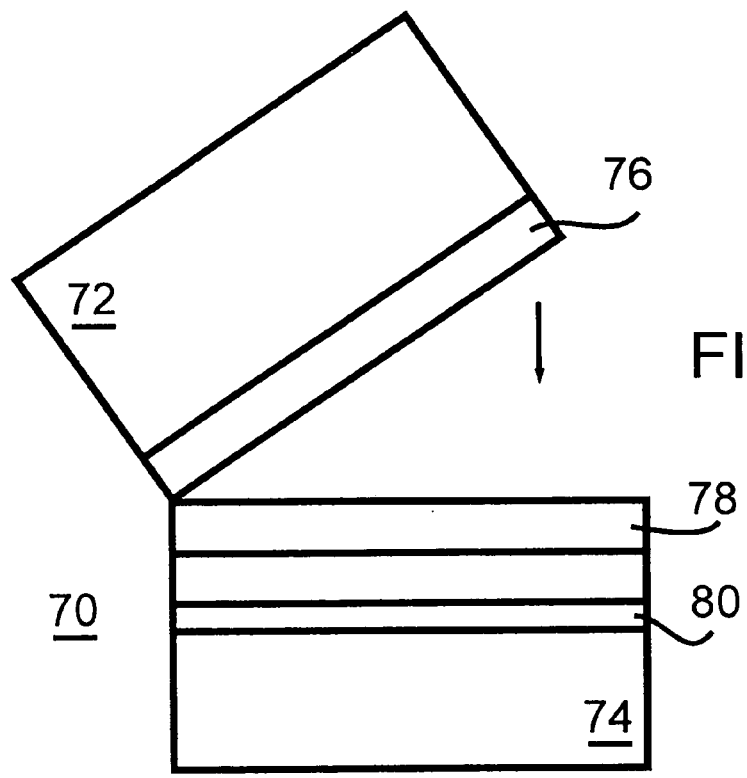
Figure 8:
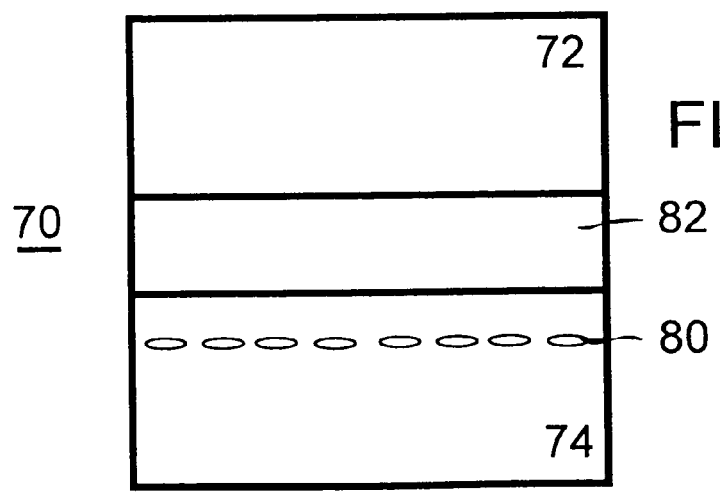

Referring additionally to FIG. 7, substrates 72 and 74 are placed in overlying relationship with the surface of oxide rich region 76 in abutting engagement with the surface of rare earth rich region 78. It will be understood that bringing the surfaces of substrates 72 and 74 into engagement produces a natural molecular bonding, commonly referred to in the industry as Van der Waal's bonding. The combined substrates are then annealed at a temperature less than approximately 1000 degrees Centigrade, which further enhances the bonding and forms blistering in hydrogen layer 80, as illustrated in simplified FIG. 8. The annealing step causes the oxygen or nitrogen in region 76 (i.e. adjacent the surface of substrate 72) to react with the rare earth in region 78 (i.e. adjacent the surface of substrate 74) to form a highly insulating layer 82 of rare earth oxide or nitride. Here it should be understood by those skilled in the art that the annealing step need only be at a sufficiently high temperature to produce the blistering in hydrogen layer 80, since the rare earth and oxygen or nitrogen will react at relatively low temperatures. Also, in many instances the rare earth oxide or nitride reaction can produce an interfacial single crystal material, e.g. RE oxide or RE nitride in crystalline form. The single crystal material is preferred, but not necessary, because of the better lattice matching with substrates 72 and 74 and because of the better insulating properties.

Figure 9:
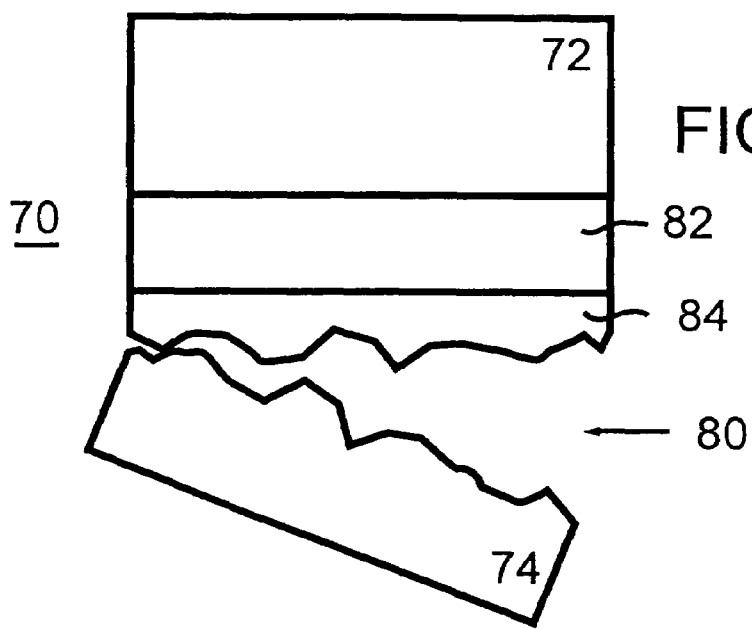
Figure 10:
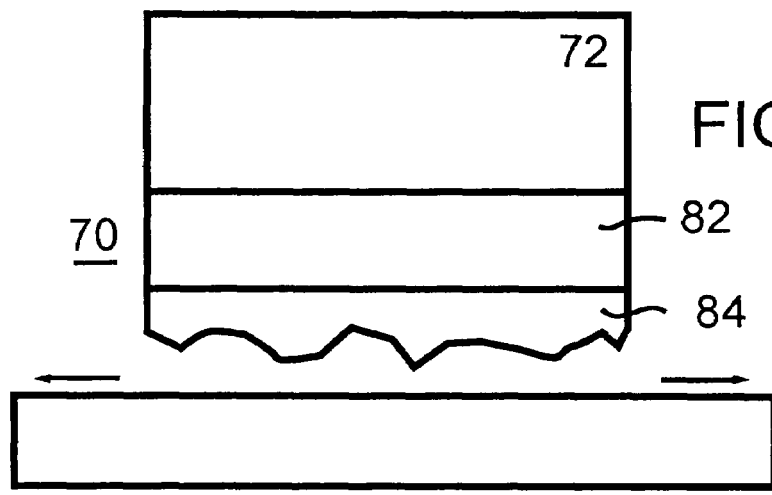
Figure 11:
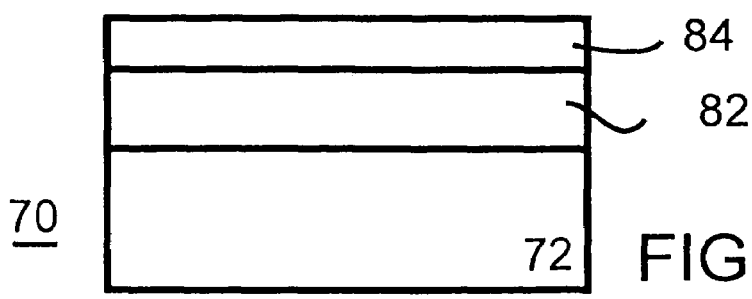
FIG. 11 is a side view of a silicon-on-insulator wafer or substrate, fabricated in accordance with the present invention, which can be used to produce the fully depleted transistor of FIG. 3.

The blistering of hydrogen layer 80 produces a weakened fracture plane, which can then be cleaved, as illustrated in FIG. 9, to remove all of substrate 74 except the active layer, designated 84 in FIG. 9. The surface of active layer 84 is then polished by any convenient method (e.g. CMP), as illustrated diagrammatically in FIG. 10, to produce a smooth surface, illustrated in FIG. 11. By properly selecting the rare earth introduced into region 78 when forming insulating layer 82, any stress in layer 82 can be substantially removed so that active layer 84 is freestanding (i.e. unstressed) and can, therefore be formed as thin as desired (e.g. in a range of 150 to 500 angstroms). That is, if active layer 84 were stressed by forming it only on, for example, a silicon dioxide layer it could not be treated as bulk silicon because it would be elastically deformed (i.e. strained) by the stress when the layer is too thin. Alternatively, by properly selecting the rare earth introduced into region 78 when forming insulating layer 82, any desired stress can be formed in layer 82 to provide higher performance of semiconductor components formed in/on layer 84.

Thus, new and improved semiconductor-on-insulator semiconductor wafers have been disclosed. The new and improved semiconductor-on-insulator semiconductor wafers may be used, generally, in a large variety of semiconductor products. Because the RE oxide or RE nitride layer can be formed very thin and because it includes higher quality insulating material, such as nitrides and rare earths, the wafers can be used to manufacture high quality and very small field effect transistors, CMOS circuits, and the like. Also, because the insulating layer 82 contains a rare earth oxide or a rare earth nitride, impurity diffusion from the handle wafer (Substrate 72 in this example) is reduced or eliminated so that a lower quality handle wafer can be used, thereby resulting in substantially reduced cost.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a semiconductor-on-insulator semiconductor substrate comprising the steps of:
   providing a first semiconductor substrate with a surface;
   introducing one of oxygen and nitrogen into a region adjacent the surface of the first semiconductor substrate;
   providing a second semiconductor substrate with a surface;
   introducing a rare earth into a region adjacent the surface of the second semiconductor substrate;
   bonding the surface of the first semiconductor substrate to the surface of the second semiconductor substrate including annealing to react the one of oxygen and nitrogen in the region adjacent the surface of the first semiconductor substrate with the rare earth in the region adjacent the surface of the second semiconductor substrate to form an interfacial insulating layer of one of rare earth oxide and rare earth nitride; and
   removing a portion of one of the first semiconductor substrate and the second semiconductor substrate to form a thin crystalline active layer on the insulating layer.

2. A method as claimed in claim 1 wherein the step of introducing one of oxygen and nitrogen includes one of implanting and evaporating the one of oxygen and nitrogen.

3. A method as claimed in claim 1 wherein the step of introducing the rare earth includes one of implanting and evaporating the rare earth.

4. A method as claimed in claim 3 wherein the step of introducing the rare earth includes introducing one of Erbium (Er) and Ytterbium (Yb).

5. A method as claimed in claim 1 wherein the step of providing the first semiconductor substrate includes providing a first crystalline silicon wafer.

6. A method as claimed in claim 1 wherein the step of providing the second semiconductor substrate includes providing a second crystalline silicon wafer.

7. A method as claimed in claim 1 wherein the step of bonding the surface of the first semiconductor substrate to the surface of the second semiconductor substrate includes using Van der Waal's bonding.

8. A method as claimed in claim 1 wherein the step of annealing includes annealing at a temperature less than 1000 degrees centigrade.

9. A method as claimed in claim 8 wherein the step of removing a portion of one of the first semiconductor substrate and the second semiconductor substrate includes implanting a hydrogen layer in the one of the first semiconductor substrate and the second semiconductor substrate prior to annealing and cleaving the portion at the hydrogen layer subsequent to annealing.

10. A method of fabricating a semiconductor-on-insulator semiconductor substrate comprising the steps of:
   providing a first crystalline silicon substrate with a surface;
   implanting one of oxygen and nitrogen into a region adjacent the surface of the first silicon substrate;
   providing a second crystalline silicon substrate with a surface;
   implanting a rare earth into a region adjacent the surface of the second silicon substrate;
   bonding the surface of the first silicon substrate to the surface of the second silicon substrate including annealing to react the one of oxygen and nitrogen in the region adjacent the surface of the first silicon substrate with the rare earth in the region adjacent the surface of the second silicon substrate to form an interfacial insulating layer of one of rare earth oxide and rare earth nitride; and
   removing a portion of one of the first silicon substrate and the second silicon substrate to form a thin crystalline active silicon layer on the insulating layer.

11. A method as claimed in claim 10 wherein the step of annealing includes annealing at a temperature less than 1000 degrees centigrade.

12. A method as claimed in claim 11 wherein the step of removing a portion of one of the first silicon substrate and the second silicon substrate includes implanting a hydrogen layer in the one of the first silicon substrate and the second silicon substrate prior to annealing and cleaving the portion at the hydrogen layer subsequent to annealing.

13. A method as claimed in claim 12 wherein the hydrogen implant and cleaving is performed on the first silicon substrate.

14. A method as claimed in claim 13 wherein the steps of providing the first silicon substrate and providing the second silicon substrate include providing a high quality silicon substrate for the first silicon substrate and providing a lower quality silicon substrate for the second silicon substrate.

15. A method as claimed in claim 10 wherein the step of implanting the rare earth includes implanting one of Erbium (Er) and Ytterbium (Yb).

* * * * *